(12) United States Patent
Carnu et al.

(10) Patent No.: US 8,461,934 B1
(45) Date of Patent: Jun. 11, 2013

(54) EXTERNAL OSCILLATOR DETECTOR

(75) Inventors: Ovidiu Carnu, San Francisco, CA (US); Xiaoyue Wang, Santa Clara, CA (US); Shafiq M. Jamal, Gilroy, CA (US)

(73) Assignee: Marvell International Ltd., Hamilton (BM)

( * ) Notice: Subject to any disclaimer, the term of this patent is extended or adjusted under 35 U.S.C. 154(b) by 40 days.

(21) Appl. No.: 13/275,782

(22) Filed: Oct. 18, 2011

Related U.S. Application Data

(60) Provisional application No. 61/406,911, filed on Oct. 26, 2010.

(51) Int. Cl.
*H03L 7/24* (2006.01)

(52) U.S. Cl.
USPC ............ 331/46; 331/47; 331/55; 331/65; 331/108 C; 327/20; 327/21; 327/294; 327/298

(58) Field of Classification Search
USPC ....... 327/18, 20, 21, 141, 144, 162, 292–294, 327/298, 407, 526; 331/46, 47, 49, 55, 56, 331/65, 74, 76, 108 C, 172–174
See application file for complete search history.

(56) References Cited

U.S. PATENT DOCUMENTS

| | | | | |
|---|---|---|---|---|
| 5,126,695 A * | 6/1992 | Abe | ................ | 331/46 |
| 5,369,377 A * | 11/1994 | Benhamida | ................ | 331/49 |
| 5,844,435 A * | 12/1998 | Grundvig | ................ | 327/151 |
| 5,982,241 A * | 11/1999 | Nguyen et al. | ................ | 331/49 |
| 6,011,447 A * | 1/2000 | Iwasaki | ................ | 331/185 |
| 6,121,849 A * | 9/2000 | McCollough et al. | ........ | 331/175 |
| 6,473,852 B1 * | 10/2002 | Hanjani | ................ | 713/1 |
| 6,745,338 B1 * | 6/2004 | Williams | ................ | 713/501 |
| 6,900,701 B2 * | 5/2005 | Chan | ................ | 331/74 |
| 7,296,170 B1 * | 11/2007 | Richmond et al. | ........... | 713/324 |
| 7,418,614 B2 * | 8/2008 | Shirotori | ................ | 713/500 |
| 7,714,674 B2 * | 5/2010 | Guo et al. | ................ | 331/176 |

* cited by examiner

*Primary Examiner* — Levi Gannon

(57) ABSTRACT

An IC includes first and second pads. The first pad is configured to receive an external clock. Alternatively, the first and second pads are configured to be coupled to a crystal oscillator and receive a reference clock. Alternatively, the second pad is configured to be grounded. The IC includes an internal oscillator for generating an internal clock, and an oscillator detector coupled to the second pad. The oscillator detector includes a transistor having a gate coupled to the second pad configured to pull a source-drain region to a first state if the second pad receives the reference clock or allow the source-drain region to be pulled to a second state if the second pad is grounded. The IC includes a buffer for transferring the first state to the internal oscillator for keeping the internal oscillator enabled and transferring the second state to the internal oscillator for disabling the internal oscillator.

24 Claims, 9 Drawing Sheets

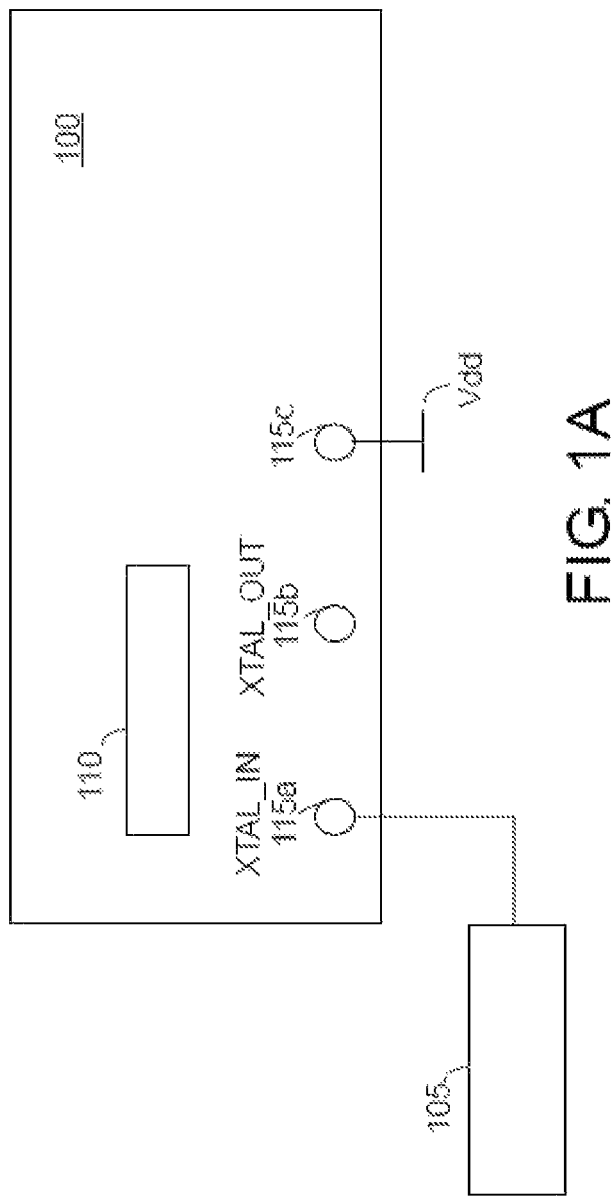

EXTERNAL OSCILLATOR DETECTOR

CROSS REFERENCE TO RELATED APPLICATIONS

The present disclosure claims the benefit of, and priority to, U.S. Provisional Patent Application No. 61/406,911, filed Oct. 26, 2010, titled "External Oscillator Detector," of Carnu et al., which is incorporated herein by reference in its entirety for all purposes.

BACKGROUND

Embodiments described herein generally relate to oscillators for integrated circuits, and more particularly, embodiments described herein relate to a detector for detecting a type of oscillator used with an integrated circuit.

Unless otherwise indicated herein, the circuits and circuit method described in the background section are not prior art to the claims in this application and are not admitted to be prior art by inclusion in the background section.

Integrated circuits (ICs) are often configured to operate under the control of a clock signal. An external-clock signal may be provided to an IC by an external oscillator, which is external to the IC. Alternatively, an internal-clock signal may be generated by an internal oscillator, which is internal to the IC. An engineer considering the use of an IC will often determine whether an external oscillator or an internal oscillator is to be used for an IC.

FIG. 1A is simplified circuit schematic of an IC 100 configured for use with an external oscillator 105. FIG. 1B is a simplified schematic of IC 100 configured for use with an internal oscillator 110. IC 100 may be on a chip and may include three bond pads 115a, 115b, and 115c to configure the IC for use with an external oscillator or an internal oscillator. The first bond pad 115a is referred to as the crystal-in pad and is labeled XTAL_IN in FIGS. 1A and 1B. The second bond pad 115b is referred to as the crystal-out pad and is labeled XTAL_OUT in FIGS. 1A and 1B. The third bond pad 115c is referred to as the external-internal select pad.

If the external oscillator is configured to supply an external-clock signal to IC 100, the external oscillator is coupled to the crystal-in pad, which is configured to receive the external-clock signal from the external oscillator. The external oscillator is often external to the IC package, which houses the IC. If the external oscillator is configured to provide the external-clock signal to the IC, then the internal oscillator is configured to be turned off and not generate the internal-clock signal. The external-internal select bond pad is typically coupled to a power source Vdd to indicate to the IC that an external oscillator is to supply the external-clock signal to the IC.

If an external oscillator is not configured to supply the external-clock signal the IC, then the internal oscillator is configured to generate the internal-clock signal. For the internal oscillator to generate the internal-clock signal, a crystal oscillator 120 is coupled to both the clock-in pad and the clock-out pad. The crystal oscillator is configured to provide a reference-clock signal to the internal oscillator for generating the internal-clock signal. The external-internal bond pad is typically coupled to ground to indicate to the IC that the internal oscillator is to generate the internal-clock signal.

The external-internal bond pad may be tied to Vdd or ground within the IC package in which the IC is housed. For example, a bond wire or the like may be coupled to the Vdd plane or ground plane of a lead frame of the IC package. Customers who purchase ICs, which have the option of coupling to an external clock or operating an internal clock, will specify to an IC seller whether the customer intends to use the IC with an external clock or an internal clock so that an IC with the external-internal bond pad appropriately tied to Vdd or ground is sold to the customer. IC manufacturers must therefore have two IC packaging options for such ICs, which tends to drive up the cost of designing and producing such ICs.

New ICs are needed that provide alternative options for determining within the ICs whether an external oscillator or an internal oscillator is configured to generate a clock signal for the IC.

SUMMARY

Embodiments described herein generally relate to oscillators for integrated circuits, and more particularly, embodiments described herein relate to a detector for detecting a type of oscillator used with an integrated circuit.

According to one embodiment, an integrated circuit (IC) configured to receive an external-clock signal or generate an internal-clock signal includes first and second pads. The first pad is configured to receive an external-clock signal from an external oscillator. Alternatively, the first pad and the second pad are configured to be coupled to a crystal oscillator and each receives a reference-clock signal from the crystal oscillator. Alternatively, the second pad is configured to be grounded. The IC further includes an internal oscillator configured to generate an internal-clock signal. The IC further includes a crystal-oscillator detector coupled to the second pad. The crystal-oscillator detector includes a transistor having a gate coupled to the second pad and the transistor is configured to pull a first source-drain region of the transistor to a first state if the second pad receives the reference-clock signal or allow the first source-drain region to be pulled to a second state if the second pad is grounded. The first state and the second state are different states. The IC further includes a buffer configured to transfer the first state to the internal oscillator for keeping the internal oscillator enabled and transfer the second state to the internal oscillator for disabling the internal oscillator.

According to one specific embodiment, the first state is a low state and the second state is a high state.

According to another specific embodiment, the crystal-oscillator detector includes a resistor coupled between the first source-drain region and a voltage source. A second source-drain region of the transistor is grounded. The transistor is configured to turn on if the gate receives the reference-clock signal and pull the first source-drain region to the low state. The transistor is configured to turn off if the gate is grounded.

According to another specific embodiment, the integrated circuit is configured to be powered by the voltage source.

According to another specific embodiment, the resistor includes a set of MOSFETs.

According to another specific embodiment, the crystal-oscillator detector further includes a capacitor having a first node coupled to the first source-drain region and a second node coupled to ground. The capacitor may include a set of MOSFETs. The transistor may be configure to turn on and off if the second pad receives the reference-clock signal, and the capacitor may be configured to smooth a voltage of the second state if the transistor is turned on and off by the reference-clock signal.

According to another specific embodiment, the integrated circuit of further includes circuit logic configured to respectively receive the first state and the second state from the buffer for keeping the internal oscillator enabled or disabling the internal oscillator. The transistor may be an nMOSFET.

According to another embodiment, an integrated circuit configured to receive an external-clock signal or generate an internal-clock signal includes a first pad and a second pad. The first pad is configured to receive an external-clock signal from an external oscillator, the first pad and the second pad are configured to be coupled to a crystal oscillator and each receive a reference-clock signal from the crystal oscillator, or the second pad is configured to be set to a voltage above ground. The integrated circuit further includes an internal oscillator configured to generate an internal-clock signal. The integrated circuit further includes a crystal-oscillator detector coupled to the second pad. The crystal-oscillator detector includes a transistor having a gate coupled to the second pad and the transistor is configured to pull a first source-drain region of the transistor to a first state if the second pad receives the reference-clock signal or allow the first source-drain region to be pulled to a second state if the second pad is tied to the voltage above ground. The first state and the second state are different states. The integrated circuit further includes a buffer configured to transfer the first state to the internal oscillator for keeping the internal oscillator enabled and transfer the second state to the internal oscillator for disabling the internal oscillator.

According to one specific embodiment, the first state is a high state and the second state is a low state.

According to another specific embodiment, the voltage above ground is a supply voltage for the integrated circuit.

According to another specific embodiment, the crystal-oscillator detector further includes a capacitor having a first node coupled to the first source-drain region and a second node coupled to the voltage source.

According to another specific embodiment, the capacitor includes a set of MOSFETs or is a metal-plate capacitor.

According to another specific embodiment, the transistor is configure to turn on and off if the second pad receives the reference-clock signal, and the capacitor is configured to smooth a voltage of the second state if the transistor is turned on and off by the reference-clock signal.

According to another specific embodiment, the crystal-oscillator detector includes a resistor coupled between the first source-drain region and ground. A second source-drain region of the transistor is at a supply voltage. The transistor is configured to turn on if the gate receives the reference-clock signal and pull the first source-drain region to the high state. The transistor is configured to turn off if the gate is at the voltage above ground.

According to another specific embodiment, the resistor includes a set of MOSFETs or is a polysilicon resistor.

According to another specific embodiment, the integrated circuit further includes circuit logic configured to respectively receive the first state and the second state from the buffer for keeping the internal oscillator enabled or disabling the internal oscillator.

According to another specific embodiment, the transistor is a pMOSFET.

The following detailed description and accompanying drawings provide a more detailed understanding of the nature and advantages of the present invention.

BRIEF DESCRIPTION OF THE DRAWINGS

FIG. 1A is a simplified circuit schematic of an IC configured for use with an external oscillator and FIG. 1B is a simplified circuit schematic of an IC configured for use with an internal oscillator;

DETAILED DESCRIPTION

Embodiments described herein generally relate to oscillators for integrated circuits, and more particularly, embodiments described herein provide a detector for detecting a type of oscillator used with an integrated circuit.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Integrated circuits (ICs) are often configured to operate under the control of a clock signal. The clock signal may be an external-clock signal or an internal-clock signal. An external-clock signal may be generated by an external oscillator, which is external to the IC, and may provide the external-clock signal to a pad of the IC. An internal-clock signal may be generated by an internal oscillator, which is internal to the IC. That is, the internal oscillator is an integral part of a chip forming the IC.

Figure 1B:
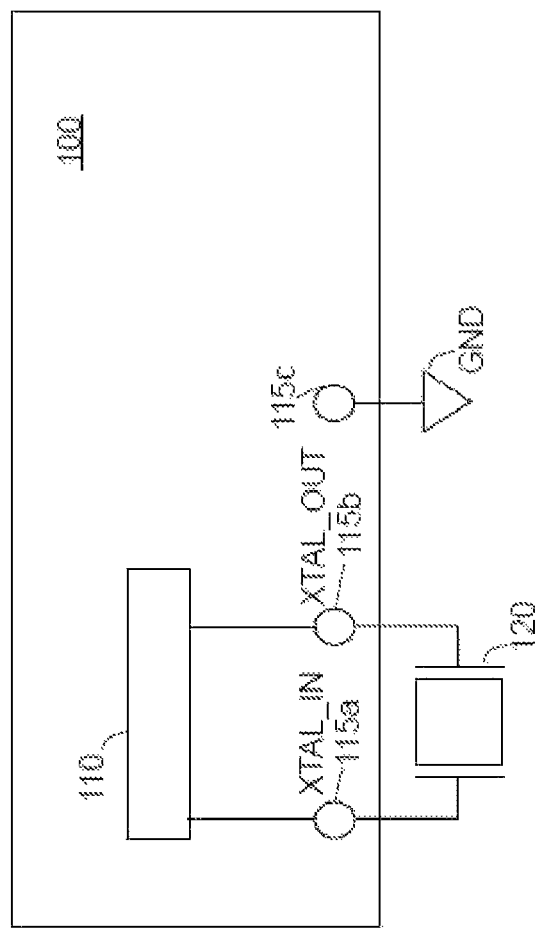
Figure 2A:
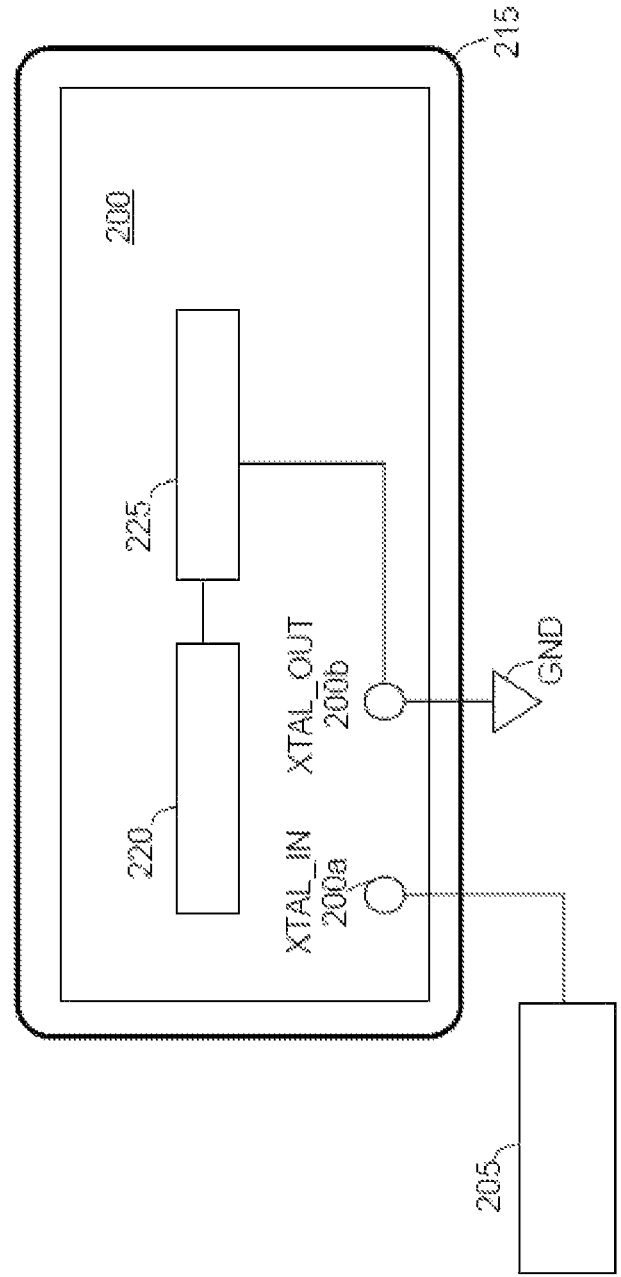
FIG. 2A is a simplified schematic of an IC coupled to an external oscillator according to one embodiment of the present invention.

FIG. 2A is a simplified schematic of an IC 200 coupled to an external oscillator 205 where the external oscillator is configured to supply an external-clock signal to the IC. IC 200 may include a crystal-in pad 200*a*, labeled XTAL_IN in FIG. 2A, and may include a crystal-out pad 200*b*, labeled XTAL_OUT in FIG. 2A. XTAL_IN and XTAL_OUT are traditional names assigned to the clock interface pads on an IC. The external oscillator may be coupled to the crystal-in pad for supplying the external-clock signal to the IC via the crystal-in pad.

The crystal-in pad and the crystal-out pad may be wire-bond pads, solder bumps, or the like for electrically coupling the IC to an IC package 215, a printed circuit board (PCB), or the like. IC 200 may further include an internal oscillator 220 and a crystal-oscillator detector 225. Internal oscillator 220 may be configured to generate an internal-clock signal for IC 200 if an external oscillator is not coupled to the IC for supplying an external-clock signal to the IC. Either the external-clock signal or the internal-clock signal may be used by the IC for clocking various circuits of the IC as will be well understood by those of skill in the art.

Figure 2B:
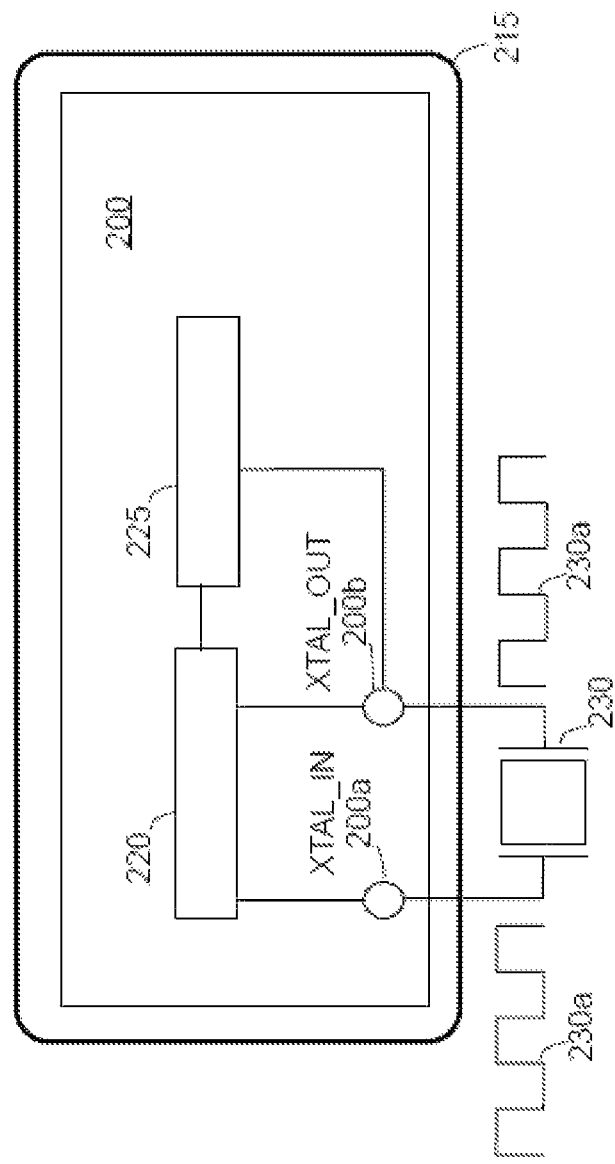
FIG. 2B is a simplified schematic of IC coupled to a crystal oscillator according to one embodiment of the present invention.

FIG. 2B is a simplified schematic of IC 200 coupled to a crystal oscillator 230. Crystal oscillator 230 may be coupled to crystal-in pad 200*a* and crystal-out pad 200*b*. Crystal oscillator 230 is configured to provide a reference-clock signal 230*a* to both the crystal-in pad and the crystal-out pad. Reference-clock signal 230*a* is configured for use by internal oscillator 220 for generating an internal-clock signal.

According to one embodiment of the present invention, if external oscillator 205 is coupled to the crystal-in pad, the crystal-out pad is configured to be grounded. The crystal-out pad may be a pad that is user accessible. That is, the crystal-out pad may be coupled to an external pin of IC package 215 where the external pin may be grounded, e.g., coupled to a ground plane of a printed circuit board (PCB) or the like.

Figure 2C:
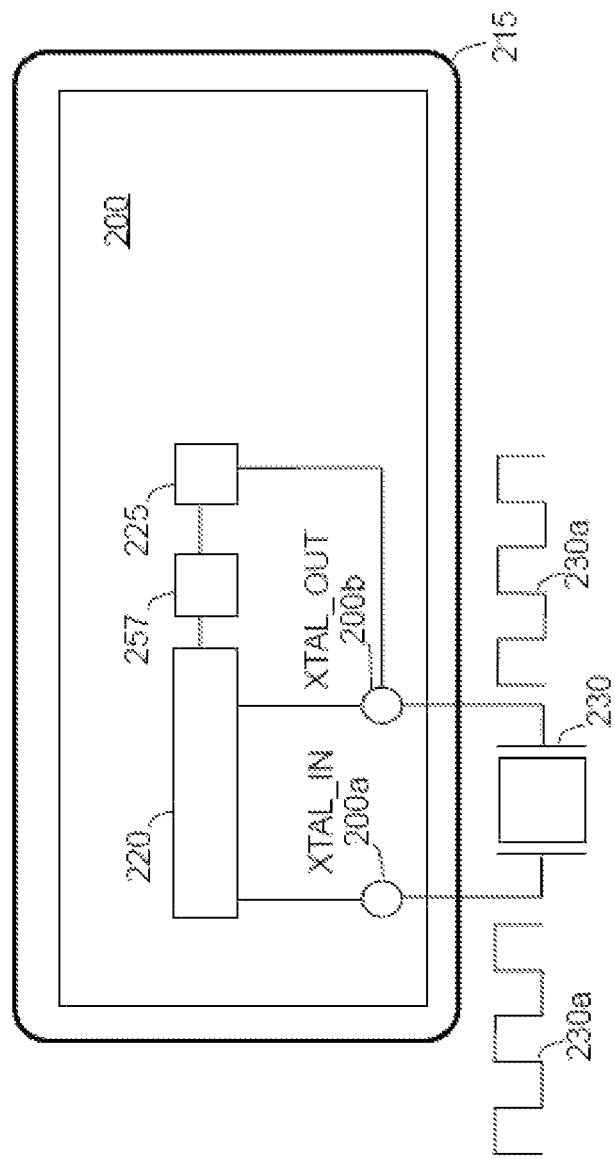
FIG. 2C is a simplified schematic of IC coupled to a crystal oscillator and having circuit logic for controlling an internal oscillator according to one embodiment of the present invention.

According to one embodiment of the present invention, crystal-oscillator detector 225 is configured to detect whether a crystal oscillator is coupled to the crystal-out pad or whether the crystal-out pad is grounded. If crystal-oscillator detector detects the reference-clock signal at the crystal-out pad, then the IC is configured to operate the internal oscillator to generate the internal-clock signal for use by the IC. Alternatively, if the crystal-oscillator detector detects that the crystal-out pad is grounded, the IC is configured to disable the internal oscillator so that external-clock signal is used for clocking the IC. According to one embodiment, circuit logic 257 of the IC is configured to initially enable the internal oscillator, and thereafter disable the internal oscillator if the crystal-oscillator detector detects that the crystal-out pad is grounded (see FIG. 2C).

The IC may be configured to initially enable the internal oscillator so that the IC will "start." For example, if the IC does not initially enable the internal oscillator and an external oscillator is not configured to provide an external-clock signal to the part, then the internal oscillator might not be started by the part because the logical assumption for not assuming that the internal oscillator should not be enabled may prevent the internal oscillator from being enabled and the IC will not have a clock signal.

Figure 3:
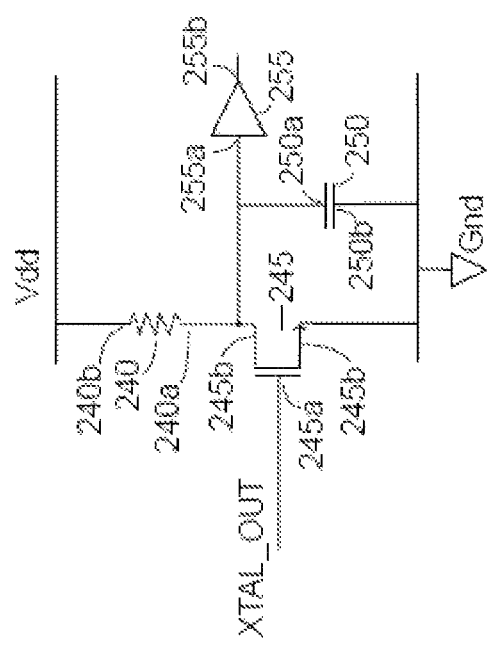
FIG. 3 is a simplified circuit schematic of crystal-oscillator detector according to one embodiment of the present invention.

FIG. 3 is a simplified circuit schematic of crystal-oscillator detector 225 according to one embodiment of the present invention. Crystal-oscillator detector 225 includes a resistor 240, a transistor 245 (e.g., an nMOSFET), a capacitor 250, and a buffer 255 (e.g., a digital buffer). Buffer 255 may include an output 255*b* that is configured to transmit a control signal that indicates whether the crystal-out pad is grounded or is receiving the reference-clock signal.

According to one embodiment, buffer 255 (and more generally the crystal-oscillator detector) is configured to control the disabling of the internal oscillator (e.g., powering down the internal oscillator) or leaving the internal oscillator enabled (e.g., powered on) to generate the internal-clock signal. According to one alternative embodiment, buffer 255 may transmit the control signal to circuit logic 257. Circuit logic 257 may include a set of circuits configured to generate one or more signals having different states based on one or more received control signals having different states. According to the alternative embodiment, circuit logic 257 is configured to control the disabling of the internal oscillator or leaving the internal oscillator enabled to generate the internal-clock signal.

According to one embodiment, a gate 245*a* of transistor 245 is coupled to the crystal-out pad. If the crystal-out pad is grounded, gate 245*a* is configured to similarly be grounded. If crystal oscillator 230 supplies a reference-clock signal to the crystal-out pad, gate 245*a* is similarly configured to receive the reference-clock signal. A first source-drain region 245*b* of transistor 245 is coupled to resistor 240 where resistor 240 is also coupled to a voltage source Vdd, such as the voltage source for the IC. That is, a first end 240*a* of resistor 240 is coupled to the first source-drain region and a second end 240*b* of resistor 240 is coupled to the voltage source Vdd. The resistor is configured to provide a resistance between first source-drain region 245*b* and voltage source Vdd. A second source-drain region 245*c* of transistors 245 is coupled to ground.

Capacitor 250 includes a first node 250*a* coupled to the first source-drain region 240*a* of transistor 245 and the first end 240*a* of resistor 240. Capacitor 250 includes a second node 250*b* coupled to ground. The first source-drain region 245*a* of transistor 245, the first end 240*a* of resistor 240, and the first node 250*a* of capacitor 250 are each coupled to an input 255*a* of buffer 255.

According to one embodiment, if the crystal-out pad is grounded, the gate of transistor 245 is also grounded and the transistor is turned off. If the transistor is turned off, the input of the buffer is pulled high to Vdd (i.e., pulled to a high state) by via the resistor coupled to the voltage source Vdd. The buffer may be configured to transmit the high state to the internal oscillator for disabling the internal oscillator. According to an alternative embodiment, the buffer is configured to pass the high state to the circuit logic where the circuit logic is configured to disable the internal oscillator.

Alternatively, if the crystal-out pad is coupled to the crystal oscillator and receives the reference-clock signal from the crystal oscillator, the gate of transistor 245 is also configured to receive the reference-clock signal. The reference-clock signal is configured to turn the transistor off and on. With the transistor turning off and on, the voltage (i.e., "low voltage") at the input of the buffer will oscillate and will be lower than Vdd. The low voltage at the input of the buffer may be substantially close to ground plus a diode drop across the transistor. This low voltage (e.g., also referred to as a low state) at the input of the buffer is smoothed by capacitor 250. While the capacitor is shown in FIG. 3 as being coupled to ground for smoothing the input to the buffer, the capacitor may be alternatively configured to provide smoothing, and/or alternative circuits may be included in the crystal-oscillator circuit for performing the smoothing function. This low voltage represents a low state at the input of the buffer. The buffer may be configured to transmit the low state to the internal oscillator for keeping the internal oscillator enabled. According to an alternative embodiment, the buffer is configured to pass the low state to the circuit logic where the circuit logic controls keeping the internal oscillator enabled so that the internal oscillator can generate the internal-clock signal. According to one embodiment, each of resistor 240 and capacitor 250 may be implemented in sets of MOSFETs. According to one alternative embodiment, the capacitor may include polysilicon plates for storing charge, may be a metal-plate capacitor, etc. Embodiments of the present invention provide for the use of one fewer bond pads on the IC because a bond pad does not need to be configured to receive a signal for indicating whether an external oscillator or an internal oscillator of the IC is to be used for clocking the IC.

Figure 4A:
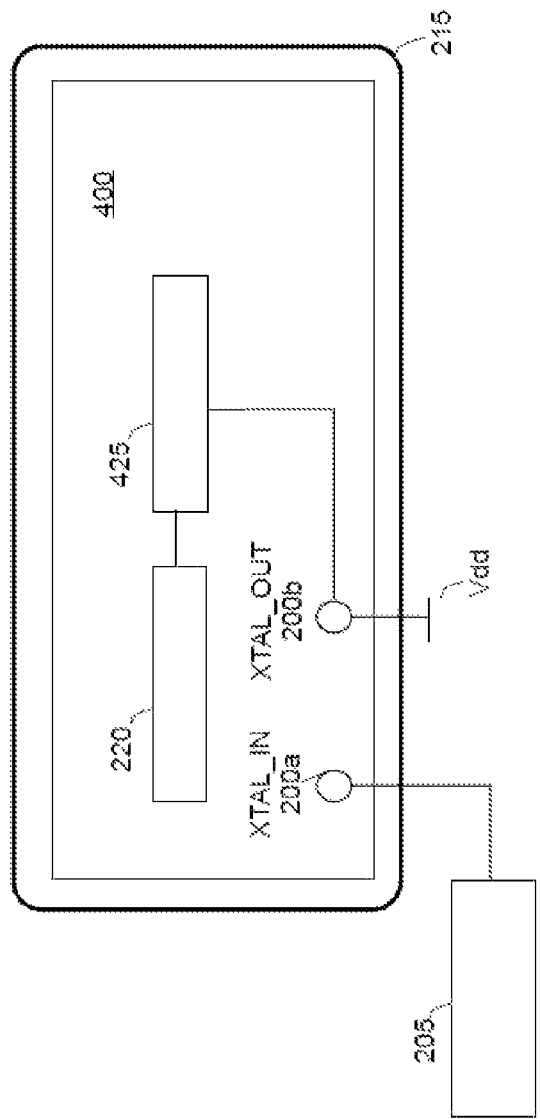
FIG. 4A is a simplified schematic of an IC coupled to external oscillator where the external oscillator is configured to supply an external-clock signal to the IC at crystal-in pad 200*a* according to one embodiment of the present invention.
Figure 4B:
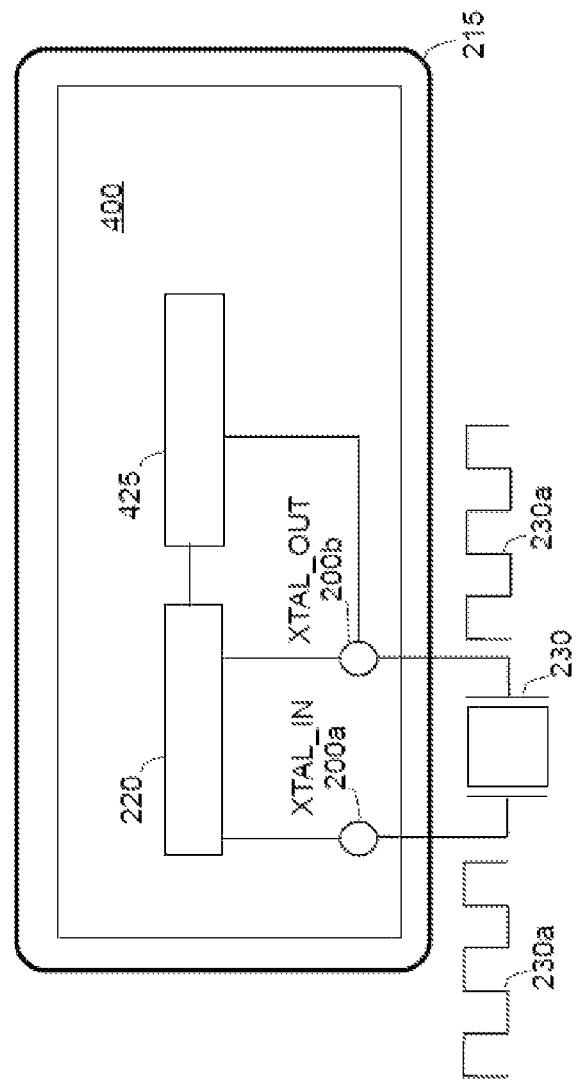
FIG. 4B is a simplified schematic of the IC shown in FIG. 4A coupled to a crystal oscillator where the crystal oscillator is configured to provide reference-clock signal to the crystal-in pad and the crystal-out pad of the IC.

FIG. 4A is a simplified schematic of an IC 400 coupled to external oscillator 205 where the external oscillator is configured to supply an external-clock signal to the IC at crystal-in pad 200*a*. FIG. 4B is a simplified schematic of IC 400 coupled to crystal oscillator 230 where the crystal oscillator is configured to provide reference-clock signal 230*a* to the crystal-in pad and the crystal-out pad. IC 400 is substantially similar to IC 200 but differs from IC 200 in that IC 400 includes a crystal-oscillator detector 425, which is configured to detect whether a crystal oscillator is coupled to the crystal-out pad or whether the crystal-out pad is at a voltage above ground, such as Vdd. If crystal-oscillator detector 425 detects the reference-clock signal at the crystal-out pad, then IC 400 is configured to operate the internal oscillator to generate the internal-clock signal for use by IC 400. Alternatively, if crystal-oscillator detector 425 detects that the crystal-out pad is tied to a voltage above ground, such as Vdd, IC 400 is configured to disable internal oscillator 425 so that the external-clock signal is used for clocking IC 400. Similar to IC 200, IC 400 may be configured to initially enable the internal oscillator so that the IC will "start." For example, if IC 400 does not initially enable the internal oscillator and an external oscillator is not configured to provide an external-clock signal to the part, then the internal oscillator might not be started by the part because the logical assumption for not assuming that the internal oscillator should not be enabled may prevent the internal oscillator from being enabled and the IC will not have a clock signal.

Figure 5:
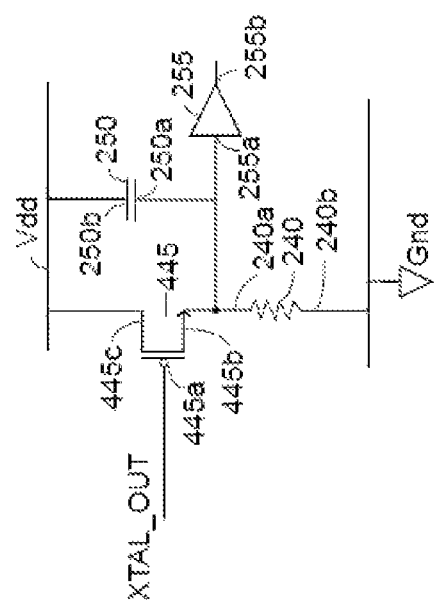
FIG. 5 is a simplified circuit schematic of crystal-oscillator detector according to another embodiment of the present invention.

FIG. 5 is a simplified circuit schematic of crystal-oscillator detector 425 according to one embodiment of the present invention. Crystal-oscillator detector 425 is substantially similar to so crystal-oscillator detector 225, but differs in that crystal-oscillator detector 425 includes a transistor 445, which may be a pMOSFET, having a gate 445a coupled to the crystal-out pad, a first source-drain region 445b coupled to a first end 240a of resistor 240, and a second source-drain region 445c coupled to Vdd. A second end 240b of resistor 240 is coupled to Vdd.

Capacitor 250 includes a first node 250a coupled to the first source-drain region 445b of transistor 445 and the first end 240a of resistor 240. Capacitor 250 includes a second node 250b coupled to Vdd. The first source-drain region 445b of transistor 445, the first end 240a of resistor 240, and the first node 250a of capacitor 250 are each coupled to an input 255a of buffer 255.

According to one embodiment, if the crystal-out pad is tied to a voltage above ground, such as Vdd, the gate of transistor 245 is also tied to the voltage above ground and transistor 445 is turned off. If the transistor is turned off, the input of the buffer is pulled low to ground (i.e., pulled to a low state) by via the resistor coupled to ground. The buffer may be configured to transmit the low state to the internal oscillator for disabling the internal oscillator.

Alternatively, if the crystal-out pad is coupled to the crystal oscillator and receives the reference-clock signal form the crystal oscillator, the gate of transistor 445 is also configured to receive the reference-clock signal. The reference-clock signal is configured to turn transistor 445 off and on. With the transistor turning off and on, the voltage at the input of the buffer will oscillate and will be higher than ground (i.e., "high voltage"). The high voltage at the input of the buffer may be substantially close to Vdd plus a diode drop across the transistor. This high voltage (e.g., also referred to as a high state) at the input of the buffer is smoothed by capacitor 250. While the capacitor is shown in FIG. 5 as being coupled to Vdd for smoothing the input to the buffer, the capacitor may be alternatively configured to provide smoothing, and/or alternative circuits may be included in the crystal-oscillator circuit for performing the smoothing function. This high voltage represents a high state at the input of the buffer. The buffer may be configured to transmit the high state to the internal oscillator for keeping the internal oscillator enabled. According to one embodiment, IC 400 may include control logic 257 shown in FIG. 2C.

The above description illustrates various embodiments of the present invention along with examples of how aspects of the present invention may be implemented. For example, while the transistor of the crystal-oscillator detector is described as being an nMOSFET, the transistor may be another transistor type, which may change the logic states of the crystal-oscillator detector, but provide the same result of keeping the internal oscillator enabled or disabling the internal oscillator. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:

1. An integrated circuit configured to receive an external-clock signal or generate an internal-clock signal, the integrated circuit comprising:
    a first pad and a second pad, wherein:
        the first pad is configured to receive the external-clock signal from an external oscillator,
        the first pad and the second pad are configured to be coupled to a crystal oscillator and each receive a reference-clock signal from the crystal oscillator, and
        the second pad is configured to be grounded;
    an internal oscillator configured to generate the internal-clock signal;
    a crystal-oscillator detector coupled to the second pad, wherein the crystal-oscillator detector includes a transistor having a gate coupled to the second pad and the transistor is configured to pull a first source-drain region of the transistor to a first state if the second pad receives the reference-clock signal or allow the first source-drain region to be pulled to a second state if the second pad is grounded, wherein the first state and the second state are different states; and
    a buffer configured to transfer the first state to the internal oscillator for keeping the internal oscillator enabled and transfer the second state to the internal oscillator for disabling the internal oscillator.

2. The integrated circuit of claim 1, wherein the first state is a low state and the second state is a high state.

3. The integrated circuit of claim 1, wherein:
    the crystal-oscillator detector includes a resistor coupled between the first source-drain region and a voltage source,
    a second source-drain region of the transistor is grounded,
    the transistor is configured to turn on if the gate receives the reference-clock signal and pull the first source-drain region to the low state, and
    the transistor is configured to turn off if the gate is grounded.

4. The integrated circuit of claim 3, wherein the integrated circuit is configured to be powered by the voltage source.

5. The integrated circuit of claim 4, wherein the resistor includes a set of MOSFETs.

6. The integrated circuit of claim 4, wherein the resistor is a polysilicon resistor.

7. The integrated circuit of claim 1, wherein the crystal-oscillator detector further includes a capacitor having a first node coupled to the first source-drain region and a second node coupled to ground.

8. The integrated circuit of claim 7, wherein the capacitor includes a set of MOSFETs.

9. The integrated circuit of claim 7, wherein the capacitor is a metal capacitor.

10. The integrated circuit of claim 7, wherein the transistor is configured to turn on and off if the second pad receives the reference-clock signal, and the capacitor is configured to smooth a voltage of the second state if the transistor is turned on and off by the reference-clock signal.

11. The integrated circuit of claim 1, further comprising circuit logic configured to respectively receive the first state and the second state from the buffer for keeping the internal oscillator enabled or disabling the internal oscillator.

12. The integrated circuit of claim 1, wherein the transistor is an nMOSFET.

13. An integrated circuit configured to receive an external-clock signal or generate an internal-clock signal, the integrated circuit comprising:
   a first pad and a second pad, wherein:
      the first pad is configured to receive the external-clock signal from an external oscillator,
      the first pad and the second pad are configured to be coupled to a crystal oscillator and each receive a reference-clock signal from the crystal oscillator, and
      the second pad is configured to be set to a voltage above ground;
   an internal oscillator configured to generate the internal-clock signal;
   a crystal-oscillator detector coupled to the second pad, wherein the crystal-oscillator detector includes a transistor having a gate coupled to the second pad and the transistor is configured to pull a first source-drain region of the transistor to a first state if the second pad receives the reference-clock signal or allow the first source-drain region to be pulled to a second state if the second pad is tied to the voltage above ground, wherein the first state and the second state are different states; and
   a buffer configured to transfer the first state to the internal oscillator for keeping the internal oscillator enabled and transfer the second state to the internal oscillator for disabling the internal oscillator.

14. The integrated circuit of claim 13, wherein the first state is a high state and the second state is a low state.

15. The integrated circuit of claim 13, wherein the voltage above ground is a supply voltage for the integrated circuit.

16. The integrated circuit of claim 15, wherein the crystal-oscillator detector further includes a capacitor having a first node coupled to the first source-drain region and a second node coupled to the voltage source.

17. The integrated circuit of claim 16, wherein the capacitor includes a set of MOSFETs.

18. The integrated circuit of claim 16, wherein the capacitor is a metal-plate capacitor.

19. The integrated circuit of claim 16, wherein the transistor is configured to turn on and off if the second pad receives the reference-clock signal, and the capacitor is configured to smooth a voltage of the second state if the transistor is turned on and off by the reference-clock signal.

20. The integrated circuit of claim 13, wherein:
   the crystal-oscillator detector includes a resistor coupled between the first source-drain region and ground,
   a second source-drain region of the transistor is at a supply voltage,
   the transistor is configured to turn on if the gate receives the reference-clock signal and pull the first source-drain region to the high state, and
   the transistor is configured to turn off if the gate is at the voltage above ground.

21. The integrated circuit of claim 20, wherein the resistor includes a set of MOSFETs.

22. The integrated circuit of claim 20, wherein the resistor is a polysilicon resistor.

23. The integrated circuit of claim 13, further comprising circuit logic configured to respectively receive the first state and the second state from the buffer for keeping the internal oscillator enabled or disabling the internal oscillator.

24. The integrated circuit of claim 13, wherein the transistor is a pMOSFET.

* * * * *